US006841871B2

(12) United States Patent  
Usami

(10) Patent No.: US 6,841,871 B2  
(45) Date of Patent: Jan. 11, 2005

(54) SEMICONDUCTOR DEVICE UTILIZING PADS OF DIFFERENT SIZES CONNECTED TO AN ANTENNA

(75) Inventor: Mitsuo Usami, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 130 days.

(21) Appl. No.: 09/861,583

(22) Filed: May 22, 2001

(65) Prior Publication Data

US 2001/0028103 A1 Oct. 11, 2001

Related U.S. Application Data

(62) Division of application No. 09/319,729, filed on Jun. 11, 1999, now Pat. No. 6,259,158.

(30) Foreign Application Priority Data

Dec. 26, 1996 (WO) ................................ PCT/JP96/03815

(51) Int. Cl.[7] .............................................. H01L 23/34
(52) U.S. Cl. ........................ 257/724; 257/773; 257/783; 257/786
(58) Field of Search ................................ 257/773, 780, 257/678, 679, 690, 723, 724, 784, 783, 786; 438/612, 613, 118, 119; 174/255, 259

(56) References Cited

U.S. PATENT DOCUMENTS

| | | | |
|---|---|---|---|
| 4,860,087 A | | 8/1989 | Matsubara et al. |
| 5,135,890 A | * | 8/1992 | Temple et al. ............. 438/123 |
| 5,155,068 A | | 10/1992 | Tada |
| 5,391,501 A | | 2/1995 | Usami et al. |
| 5,604,379 A | * | 2/1997 | Mori .......................... 257/738 |
| 5,689,136 A | | 11/1997 | Usami et al. |
| 5,703,755 A | * | 12/1997 | Flesher et al. .............. 361/737 |
| 5,705,852 A | * | 1/1998 | Orihara et al. .............. 257/679 |
| 5,744,383 A | * | 4/1998 | Fritz .......................... 438/111 |
| 5,925,931 A | * | 7/1999 | Yamamoto .................. 257/737 |

(List continued on next page.)

FOREIGN PATENT DOCUMENTS

| | | |
|---|---|---|
| JP | 63-267598 | 11/1988 |
| JP | 3-87299 | 4/1991 |
| JP | 4-341896 | 11/1992 |
| JP | 7-99267 | * 4/1995 |
| JP | 8-15167 | 2/1996 |
| JP | 8-287208 | 11/1996 |
| JP | 9-45724 | 2/1997 |

OTHER PUBLICATIONS

"IC Card," Corporation of the Institute of Electronics, Information and Communication Engineering and published by Ohm Co., Ltd., First Edition, May 25, 1990, p. 33.

*Primary Examiner*—Alonzo Chambliss  
(74) *Attorney, Agent, or Firm*—Mattingly, Stanger & Malur, P.C.

(57) ABSTRACT

Concerning a plurality of second bonding pads that are electrically connected with a plurality of first bonding pads provided on an IC chip and having a predetermined narrow pitch, a technique is disclosed that allows the plurality of second pads to be provided on the IC chip. This makes it possible to provide the second pads at desired positions. Accordingly, it becomes possible to form, by printing with a low accuracy, respective interconnections that connect the plurality of second pads with a plurality of electrodes provided on a substrate. Also, matching of positions is executed between the plurality of second pads and the plurality of electrodes formed on the substrate by printing. This matching makes it possible to electrically connect the second pads with the electrodes provided on the substrate in a such a manner that they are opposed to each other.

12 Claims, 16 Drawing Sheets

U.S. PATENT DOCUMENTS

| | | |
|---|---|---|
| 5,986,341 A | 11/1999 | Usami et al. |
| 6,051,877 A | 4/2000 | Usami et al. |
| 6,111,628 A * | 8/2000 | Shiota et al. ............... 349/150 |
| 6,140,697 A | 10/2000 | Usami et al. |
| 6,166,911 A | 12/2000 | Usami et al. |
| 6,259,158 B1 * | 7/2001 | Usami ....................... 257/724 |
| 6,320,753 B1 * | 11/2001 | Launay ....................... 361/760 |
| 6,459,588 B1 * | 10/2002 | Morizumi et al. .......... 361/737 |

* cited by examiner

Large Pad Size : 300x600 μm

Small Pad Size : 100x100 μm

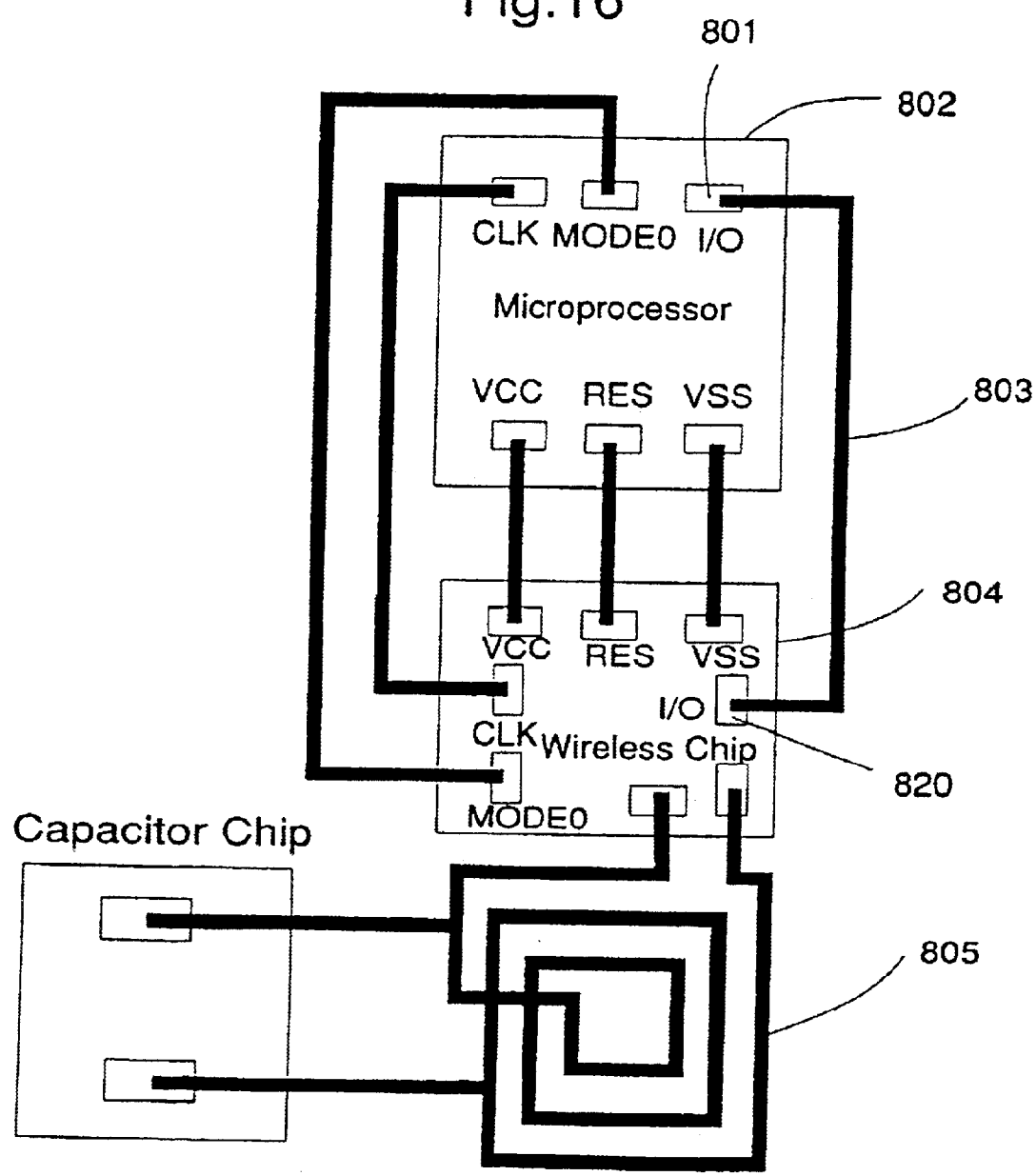

SEMICONDUCTOR DEVICE UTILIZING PADS OF DIFFERENT SIZES CONNECTED TO AN ANTENNA

This application is a divisional application of U.S. Ser. No. 09/319,729, filed Jun. 11, 1999, now U.S. Pat. No. 6,259,158.

TECHNICAL FIELD

The present invention relates to a semiconductor device in which various types of semiconductors having external extraction electrodes (pads) with a small pitch are implemented on a substrate such as a card, and a method of manufacturing the semiconductor device.

BACKGROUND ART

The structure of an IC card that is being mass-produced at present is disclosed in "IC card" (edited by Corporation of the Institute of Electronics, Information and Communication Engineering and published by Ohm Co., Ltd. on May 25, 1990, first edition, pp. 33). FIG. 13 illustrates a cross sectional structure of its representative main portion. As is illustrated in FIG. 13, the conventional IC card includes a module substrate 44 having a conductor circuit, an IC chip 43 implemented on the module substrate, pads 42 provided on the IC chip, and bonding wires 41 to which terminals of the module substrate are connected.

FIG. 4 is a plan view illustrating an IC chip in which wires are bonded. In this method using the wires, a semiconductor active area 102 on the IC chip and bonding pads 42 thereon are situated at different regions with each other. A bonding wire head 132 is a portion situated at the head of a bonding wire 41.

FIG. 5 illustrates a cross section of the bonding portion illustrated in FIG. 4. The bonding pad 42, which is formed on an IC chip 44, is pressed strongly by the bonding wire head 132 at the time of the bonding. The bonding wire 41 is pressed by a mechanical operation, thereby being caused to be connected to the bonding pad. This sometimes results in a destruction of an active element if it exists under the bonding pad. Accordingly, in the prior art, it was impossible to locate the active element.

Also, in the case of an IC chip of 0.3 mm square that is used in, for example, an IC tag, although size of the bonding pad is in the range of 0.1 to 0.15 mm square and the number of the bonding pads is in the range of about 2 to 10, it turns out that an area that the bonding pads occupy on the IC chip becomes considerably large.

Incidentally, the IC chip is about 200 to 400 $\mu$m thick. In this extent of thickness, especially when a main semiconductor material of which the IC chip is composed is a fragile silicon, there existed a fear that the IC chip is cracked if a bending stress is applied thereto. The larger the IC chip gets, the more apparent this tendency becomes. Conventionally, in order to prevent the IC chip from being cracked, it was necessary to select and use a bending-resistant material as a casing material so that no bending stress is applied to the IC chip. In order to solve this problem, an IC card using a flexible IC chip made thin up to about 1 $\mu$m is disclosed in JP-A-3-87299. Concerning the IC card disclosed here, however, it has been found that the following problem exists: Since the IC chip thus thinly filmed is located on the surface of the card substrate, the IC chip is torn if the bending stress especially an expansion stress is applied to the card.

As a method for solving problems like this, JP-A-7-99267 discloses a method of embodying a configuration that a thin type IC chip is provided substantially in proximity to the center of the IC card. In this technique, the pads on the IC chip and electrodes provided on the circuit substrate by printing are set so that they are exposed onto the same plane, and then interconnections between the pads on the IC chip and the electrodes on the circuit substrate are formed by printing with the use of a conductive paste, thereby connecting them electrically. The use of the conductive paste makes it unnecessary to execute the process of the wire bonding, which is economical in fabricating the IC card.

It has become obvious, however, that there exists the following problem when the connection with the pads on the IC chip is established by the above-described printing with the use of the conductive paste: That is to say, since a pitch of the pads formed on the existing IC chip is small and falls in the range of 100 to 150 $\mu$m, the wire bonding is capable of establishing the connection, whereas screen printing with the use of a silver paste is not capable of establishing the connection. Namely, this is a problem that, with the use of the existing technique, it is difficult to make the printing accuracy 200 $\mu$m or less. This problem becomes a serious trouble when the IC chip in which the conventional wire bonding is performed is used without any improvements or modifications.

It is an object of the present invention to provide a semiconductor device in which narrowly-pitched pads formed on an IC chip and electrodes provided on a substrate are connected electrically with each other by interconnections formed by printing, and a method of manufacturing the semiconductor device that allows them to be connected under a stable condition.

It is another object of the present invention to provide a highly reliable semiconductor device in which the narrowly-pitched pads formed on the IC chip and the electrodes printed on the substrate are connected electrically with each other, and a low cost method of manufacturing the semiconductor device that accompanies no increase in the number of the processing steps.

DISCLOSURE OF INVENTION

The above-described purposes are accomplished by providing, on the IC chip, a second pad electrically connected to a first pad provided on the IC chip. Since it is possible to provide the second pad in a desired position, it is possible to form, by printing, the respective interconnections for connecting a plurality of second pads with the plurality of electrodes provided on the substrate. Also, matching of positions is performed between the plurality of second pads and the plurality of electrodes provided on the substrate, thereby making it possible to electrically connect the second pads with the electrodes provided on the substrate in a such a manner that they are opposed to each other. Conductive adhesives are provided between the second pads and the electrodes provided on the substrate, thereby making it possible to enhance a reliability of the connection.

Also, the above-described purposes are accomplished by a method of manufacturing a semiconductor device which includes the following steps of: Preparing an IC chip having the plurality of pads, forming a first insulating film having a first aperture onto which the pads are exposed, forming a first metallic film on the substrate having the first insulating film, forming a second insulating film which extends from the first aperture onto the first insulating film and has an aperture in a region becoming the second pads and onto which the first metallic film is exposed, selectively forming a second metallic film on the first metallic film exposed, removing the second insulating film, removing the exposed first metallic film so as to form the second pads including the first metallic film and the second metallic film, and electrically connecting the second pads with the electrodes provided on the insulating substrate.

Incidentally, the second pads are formed in an active area on the IC chip, thereby making it unnecessary to enlarge the chip areas for formation of new pads. This allows the upper surface of the IC chip to be used effectively.

Also, it is possible to fabricate a bump toward the first pad and the second pads in the same processing step. This, accordingly, results in no increase in the fabrication cost of the IC chip.

Also, positions of the plurality of second pads are aligned with those of the plurality of electrodes on the insulating substrate, thereby allowing a face down bonding to be performed toward the insulating substrate of the IC chip. This makes it possible to shorten distances between the second pads and the electrodes and to reduce resistance in the interconnections.

Also, a gold plated film, which is a technique used customarily, is employed as the second metallic film. This makes it possible to enhance a reliability of the second pads.

Also, thickness of the insulating substrate is made equal to 0.25 mm or less, and thickness of the IC chip is made equal to 100 $\mu$m or less, preferably, 50 $\mu$m. These transactions make each of them flexible, thus permitting the IC chip to be easily connected to the insulating substrate through the adherence. Namely, when the IC chip is flexible as described above, the IC chip is allowed to be transformed. Even if there exist pits and projections on the surface of the insulating substrate, this transformation i.e. deformation permits the IC chip to be connected to the insulating substrate through the adherence.

The interconnections toward the plurality of second pads are located in such a manner that they do not intersect with each other. This prevents an electrical short from being caused among them.

Also, the first insulating film is selected from films of a customarily used polyimide resin, a silicon nitride, a silicon oxide and a combination thereof, thereby enhancing the reliability.

Also, a second insulating substrate is provided in such a manner that it is opposed to the insulating substrate, thus sandwiching the IC chip therebetween. Then, the IC chip is caused to be located on a region included within ±15% of a neutral plane formed by these insulating substrates. This makes it possible to reduce breakage of the IC chip.

Additionally, the substrate on which the IC chip is implemented is not limited to the card substrate.

According to the present invention, it is possible to easily connect the IC chip having the narrowly-pitched conventional pads with the electrodes that are provided on the substrate by using a method such as the screen printing with the use of the silver paste.

Namely, according to the present invention, by forming pads obtained by expanding the conventional bonding pads, it is possible to expand the pad pitch and the pad size. Accordingly, the pad pitch is permitted to become a pitch suitable for the silver paste screen printing technique. This makes it possible to form a substrate pattern and to connect the IC chip under a stable condition.

Also, since it is possible to provide the expanded pads on the semiconductor active area, it is possible to reduce the chip size. For example, in the case where the silver paste is used, even one-half times downsizing is possible.

BRIEF DESCRIPTION OF DRAWINGS

FIG. 16 is a conceptual diagram of an IC card fabricated using the IC chip illustrated in FIG. 9.

BEST MODE FOR CARRYING OUT THE INVENTION

First Embodiment

Figure 1:
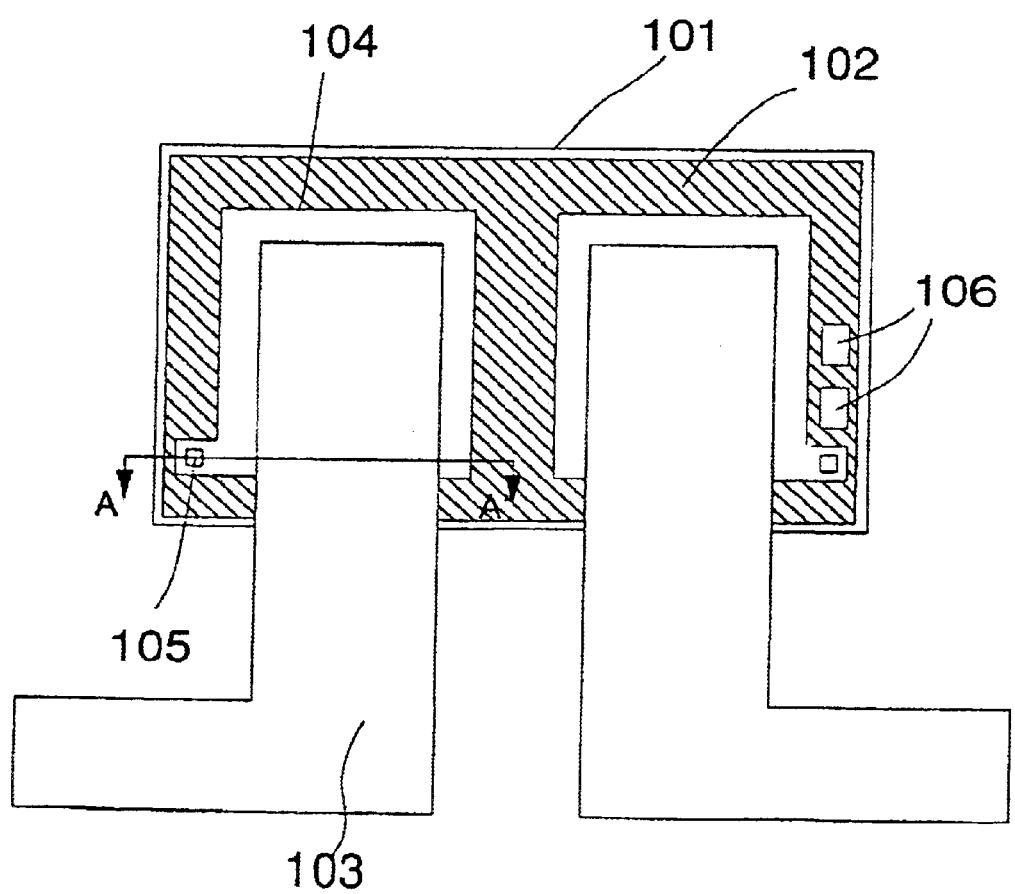
FIG. 1 is a plan view illustrating connected portions between pads on an IC chip related with the present invention and electrodes provided on an insulating substrate.

The explanation will be given below concerning the present invention, using FIG. 1. FIG. 1 illustrates connected portions between pads on an IC chip related with the present invention and electrodes 103 provided on an insulating substrate. Second pads (expanded pads) 104 electrically connected to first pads (small pads) 105 are provided on an active area 102 on an IC chip 101. Elements such as semiconductor transistors and diode resistance elements are formed on the active area 102. These elements, which are connected with each other by interconnections as required, exhibits functions such as a specific memory or logic. The expanded pads 104 are connected with the small pads 105. Additionally, small pads 106 are testing pads for testing circuit operation of the IC chip 101. Thus, there is no need of forming them when the test is unnecessary.

Also, the expanded pads 104 are connected with the electrodes 103 by using conductive adhesives.

Figure 2:
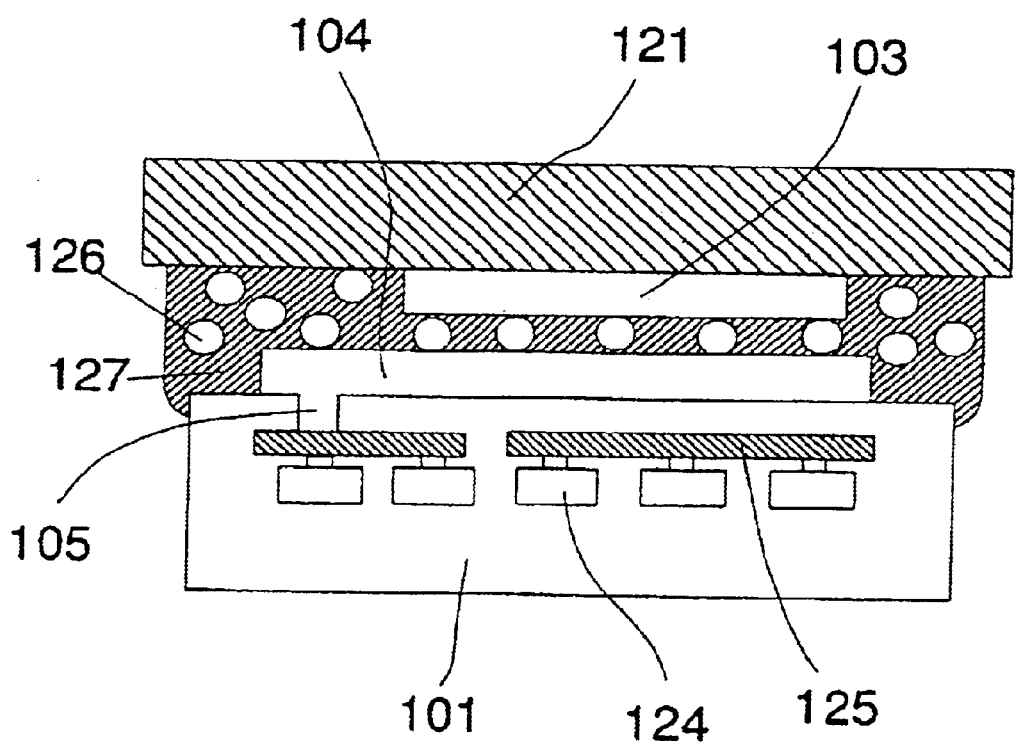
FIG. 2 is a main portion cross sectional view illustrating the connected portions between the pads on the IC chip related with the present invention and the electrodes provided on the insulating substrate.

FIG. 2 illustrates a cross section indicated by A and A' illustrated in FIG. 1. The printed electrode 103 is provided on a card substrate 121. Also, on the IC chip 101, there is provided the active area on which there is provided a plurality of semiconductor elements 124 connected to each other by an interconnection 125. On the active area, there is provided the expanded pad 104 connected to the small pad 105. The expanded pad 104 and the electrode 103 are electrically connected and at the same time are fixed with each other by an anisotropic conductive adhesive film containing conductive particles 126.

Figure 3:
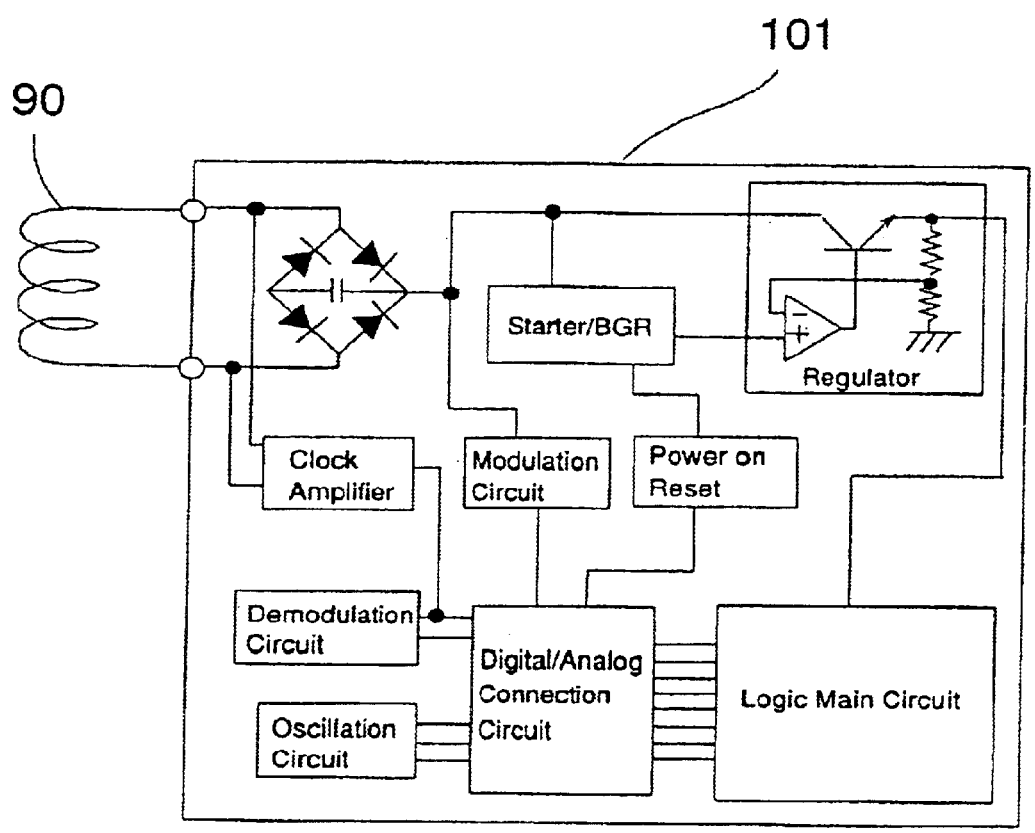
FIG. 3 illustrates an example of a configuration diagram of an IC chip circuit related with the present invention.
Figure 4:
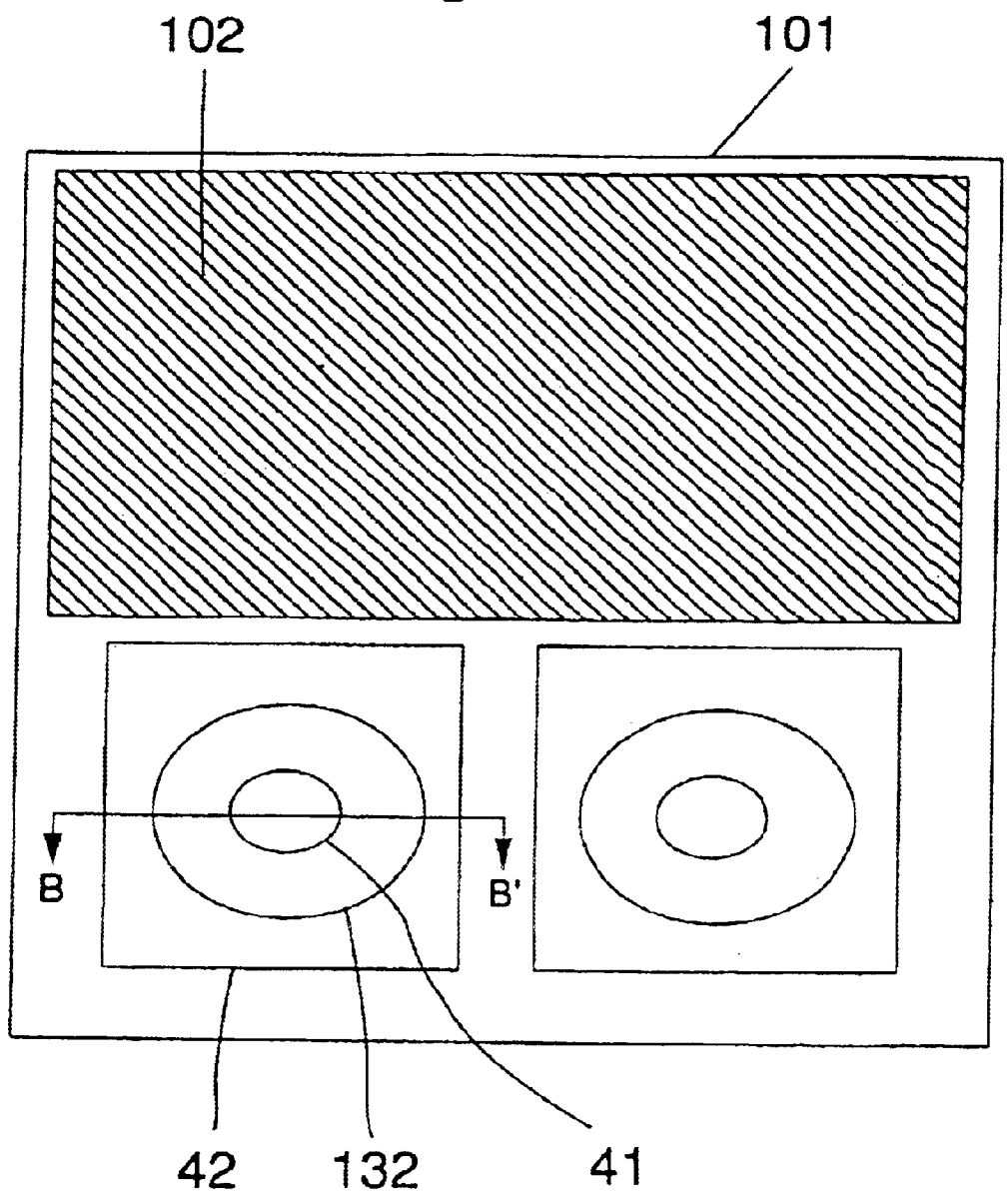
FIG. 4 is a plan view of a conventional IC chip in which wires are bonded.
Figure 5:
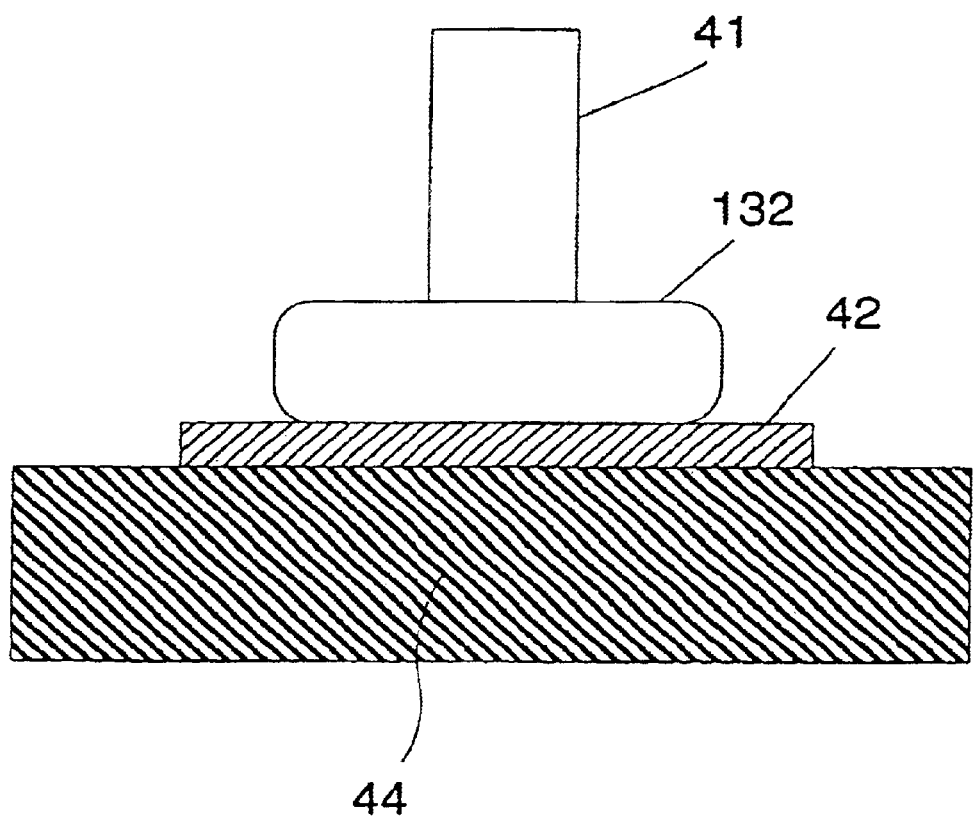
FIG. 5 is a main portion cross sectional view of the conventional IC chip in which the wires are bonded.

FIG. 3 illustrates a configuration diagram of an inner circuit of the IC chip 101. The IC chip 101 employed here is a chip used for wireless communication. Accordingly, inside the chip, there are provided electrical circuits, which transforms a power supplying electromagnetic wave fed for operating the ICs into a predetermined voltage, and a modulation/demodulation circuit for transferring data stored within the IC chip by the wireless communication. Also, the ICs are connected with a coil 90 used as an antenna. Incidentally, the above-mentioned circuits are unnecessary in the case of a contact IC card.

Additionally, a starter is a circuit that detects the electric potential so as to generate a reference voltage. A regulator is a circuit that generates, from the reference voltage, a power supply voltage having a small impedance. A power on reset is a circuit that releases a reset after the electric potential has been determined. A digital/analog connection circuit is a circuit that switches an analog-to-digital circuit. A clock amplifier is a circuit that amplifies an infinitesimal voltage from the antenna coil up to a clock waveform with a large amplitude.

Figure 6:
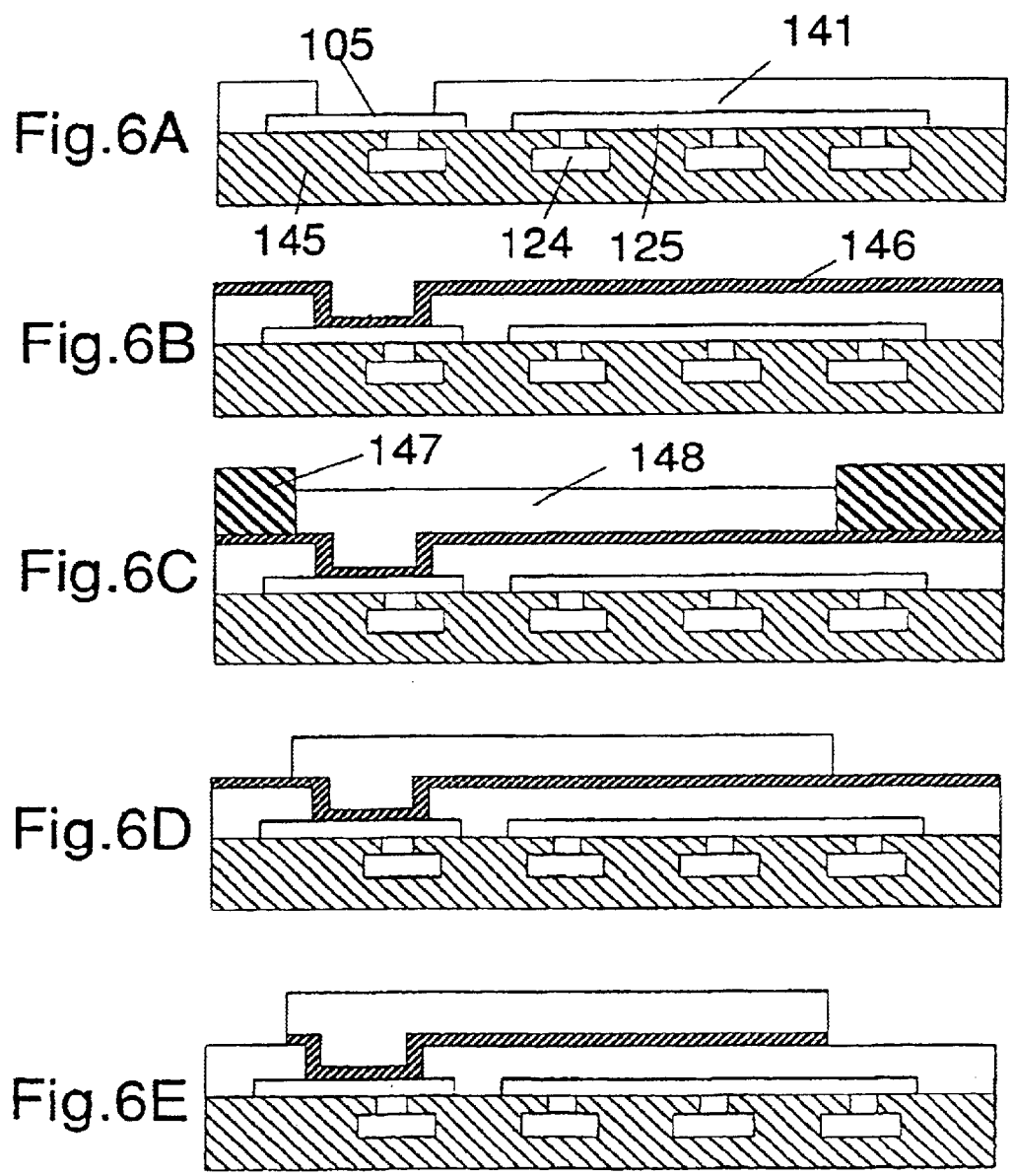
FIGS. 6A to 6E show main portion cross sectional views of a semiconductor device for indicating a process flow of the IC chip related with the present invention.

FIGS. 6A to 6E illustrate a fabricating process of the expanded pad 104. FIG. 6A illustrates a cross section of a main portion of the semiconductor device in a state in which, after the semiconductor elements 124 and the interconnection 125 are formed on a silicon substrate 145, a polyimide resin film (first insulating film) 141 (about 100 $\mu$m thick), which has an aperture onto which the small pad 105 is exposed, has been formed.

After that, a laminated film (first metallic film) (about 200 nm/about 200 nm thick) of titanium (Ti) and gold (Au) is deposited by evaporation (FIG. 6B).

After that, a resist film (second insulating film) 147 is formed that has an aperture becoming an expanded pad region and an interconnection region connecting the expanded pad with the small pad. Moreover, the inside of the aperture is plated selectively with a gold (Au) film (second metallic film) 148 about 15 $\mu$m thick (FIG. 6C).

After that, the resist film 147 is removed (FIG. 6D).

Furthermore, the first metallic film 146 that is exposed since the gold film 148 is not formed thereon is removed by etching (FIG. 6E).

Incidentally, although not illustrated, on the small pad to which the expanded pad is not connected, a bump is formed that is composed of a laminated film of a gold-plated film and the first metallic film.

Second Embodiment

The explanation will be given below concerning another embodiment, using FIG. 7. The present embodiment is an embodiment in which the expanded pads are formed in a non-active area on the IC chip 101. On the IC chip 101, there are provided wire bonding pads (small pads) 105 and the expanded pads 104. The expanded pad 104 is electrically connected with one of the wire bonding pad (small pad) group through a pad interconnection 12. The expanded pad 104 is electrically connected with the electrode 103 provided on the substrate. As the IC chip 101, the well known microprocessor can be used.

In the conventional microprocessor, for example, the pad pitch is about 150 $\mu$m and there are provided 40 or more of pads, including pads for testing the inner circuits. Even in the case of such narrowly-pitched pads, by using an expanded pad electrically connected with a desired small pad and using the anisotropic conductive adhesive film, it is possible to easily connect the desired small pad with an interconnection that is screen-printed on the card substrate with the use of the silver paste.

Additionally, when, using the anisotropic conductive adhesive film, the pad on the IC chip is connected with an electrode printed on the card substrate with the use of the silver paste, in order to ensure a reliability of the connection, it is desirable to form at least the surface of the pad on the IC chip with a material of non-oxidized property such as gold. The technique of forming a gold film on the conventional electrode by plating is used customarily when TAB (Tape Automated Bonding) is executed. In the present invention, it is possible to form the expanded pad in the same processing step as the forming of the gold film onto the conventional small pad surface. This, accordingly, results in no increase in the number of the processing steps.

Figure 8:
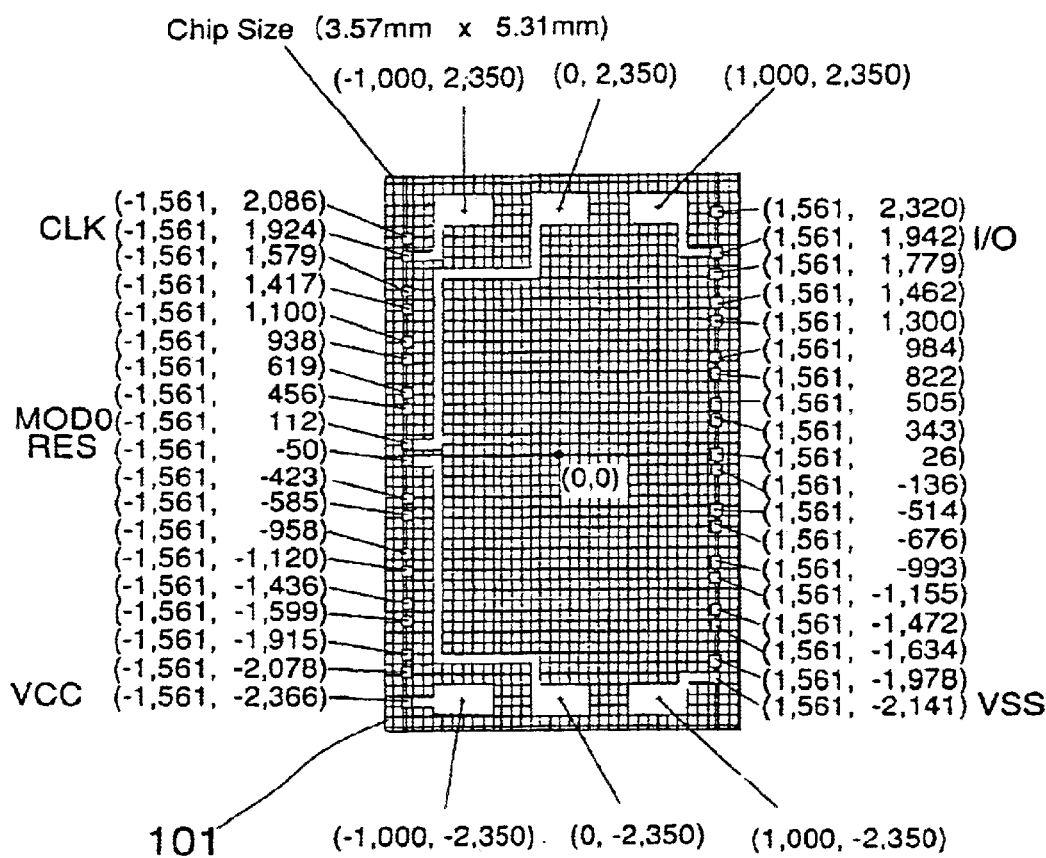
FIG. 8 is a plan view of a concrete IC chip related with the present invention.

Incidentally, in the case of the IC card, the number of the pads that require the expanded pad may be about 6 to 8. Consequently, it is sufficient to selectively choose the pads out of about 40 of the wire bonding pads (small pads) and connect them with the expanded pad. FIG. 8 illustrates a plan view of an example of the IC chip related with the present invention. There are provided 6 expanded pads (300×600 $\mu$m in size) on the IC chip 101.

Incidentally, a reference note CLK denotes a clock signal input port, MOD0 denotes a test signal input port, RES denotes a reset signal input port, VCC denotes a power supply voltage (+5V) input port, I/O denotes a data input/output port, and VSS denotes a ground input port.

Figure 9:
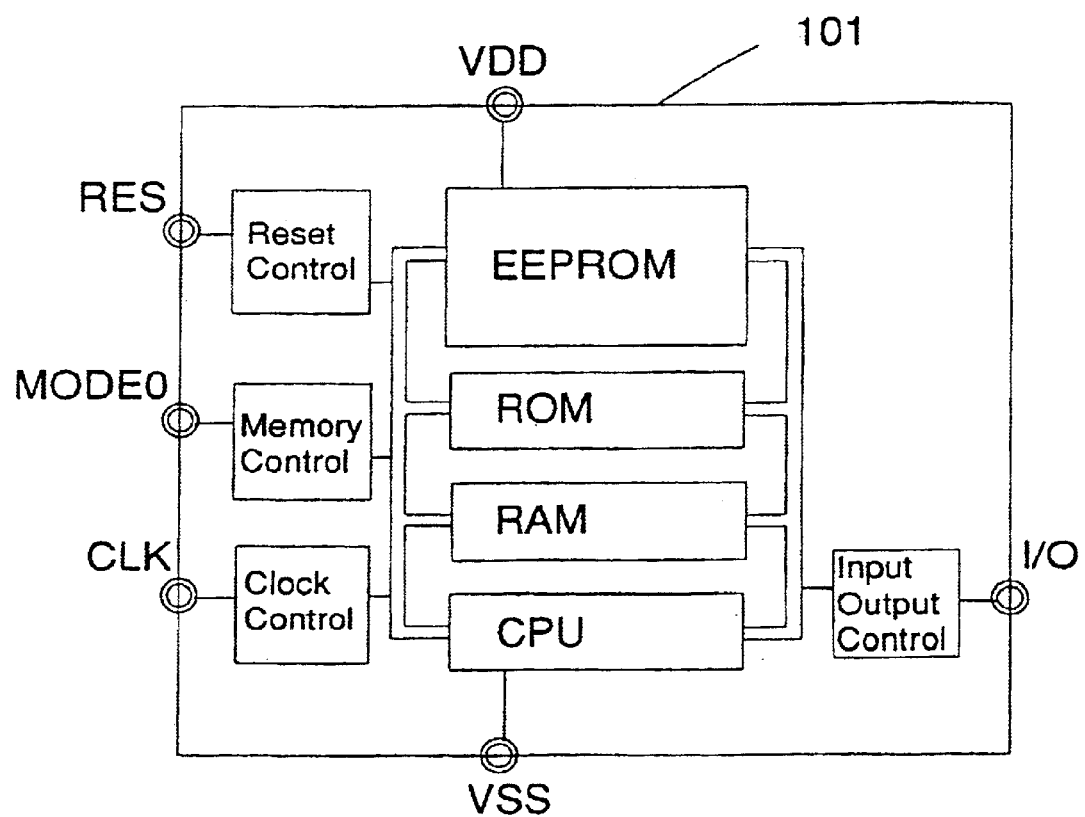
FIG. 9 is a circuit configuration diagram of the IC chip illustrated in FIG. 8.

FIG. 9 illustrates the configuration within the IC chip illustrated in FIG. 8. Within an actual IC chip 101, memories and processors are provided. The respective terminals thereof are the power supply terminals (VDD, VSS), the input/output terminal (I/O), the reset terminal (RES), a memory control terminal (MODE0), and the clock terminal (CLK).

Additionally, a reference note EEPROM denotes an electrically writable read only memory, ROM denotes a read only memory by mask (unrewritable), RAM denotes a random-accessible random access memory, and CPU denotes a unit controlling and executing a computation.

Figure 7:
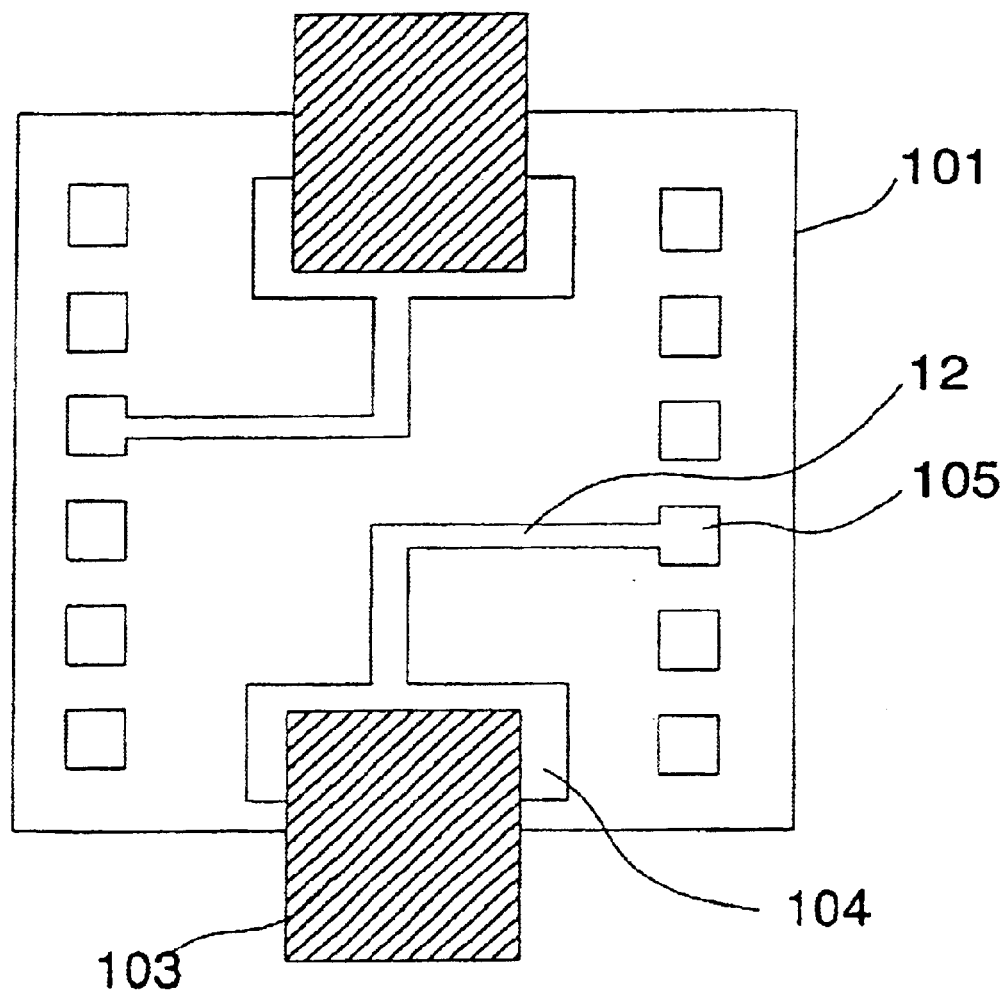
FIG. 7 is a main portion plan view illustrating the connected portions between the pads on the IC chip related with the present invention and the electrodes provided on the insulating substrate.
Figure 10:
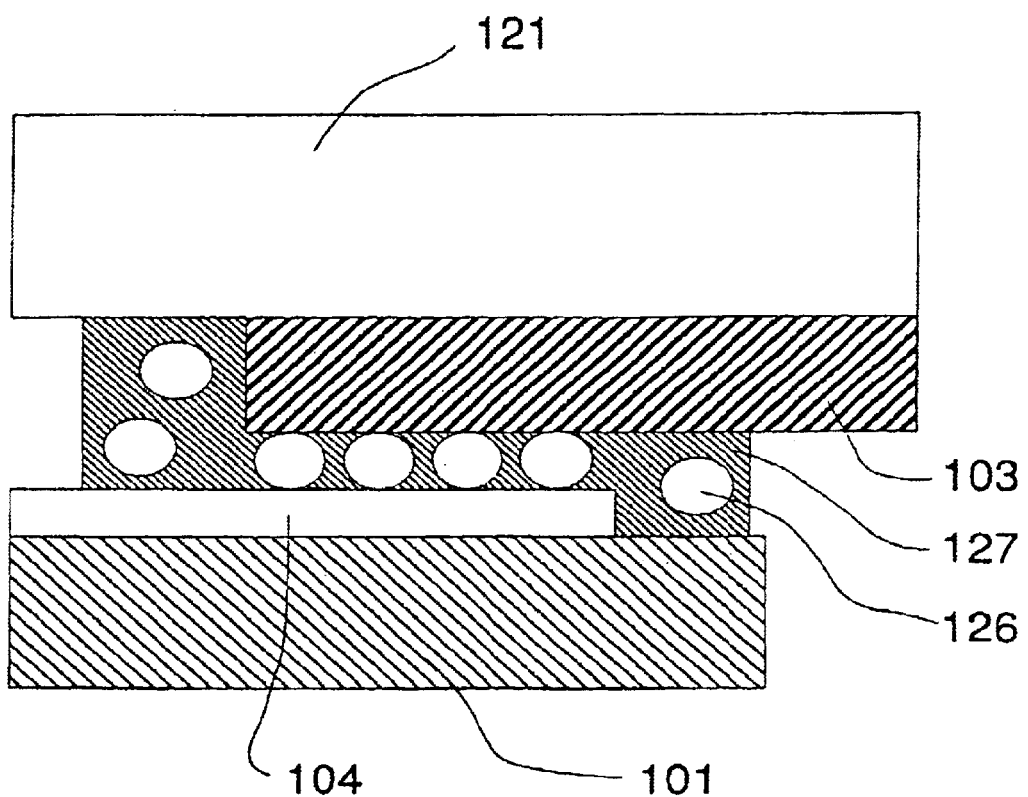
FIG. 10 is a main portion cross sectional view illustrating the connected portions between the pads on the IC chip related with the present invention and the electrodes provided on the insulating substrate.

FIG. 10 illustrates a cross sectional view of the connected portion between the IC chip 101 in the semiconductor device illustrated in FIG. 7 and the interconnection on the substrate. The substrate electrode 103, which has a desired configuration, is formed on the substrate 121 by printing. A conductive material that has been used for the printing is the silver paste.

Meanwhile, there is provided the expanded pad 104 on the IC chip 101. The substrate electrode 103 is connected with the expanded pad 104 by conductive particles 126. The conductive particles 126, which are fine particles 5 to 10 $\mu$m in diameter, are titanium-deposited plastic particles plated with gold, or fine particles of nickel. The fine particles are dispersed into an adhesive 127, and the fine particles that are sandwiched between the substrate electrode 103 and the expanded pad 104 can contribute to the connection with the electrode. In the drawing, the conduction in a vertical direction is implemented. In a horizontal direction, however, the conduction remains unimplemented since the dispersed state of the fine particles is maintained. The above-described adhesive of this kind is referred to as an anisotropic conductive adhesive material.

In the case of the connection on which the anisotropic conductive adhesive material is used, the silver paste, which is formed on the substrate in advance, is solidified by annealing, and then the substrate is stored as the printed electrode. This makes it possible to connect the substrate with the IC chip in such a manner as to take out the substrate when it is needed on the fabrication.

Also, it is possible, without using the wire bonding, to connect the IC chip with the substrate in such a manner that they are opposed to each other with the anisotropic conductive adhesive material sandwiched therebetween. This makes it possible to shorten length of the interconnections.

Even in the case where the IC chip and the substrate are opposed to each other, a thin IC chip 50 μm or less thick and a substrate 0.25 mm or less thick are used, thereby allowing a thin IC card to be provided.

Also, an epoxy thermalsetting resin is employed as a main composition of the adhesive material, thereby making it possible to bring about the following effects: Preventing corrosion of the conductor films at the connected portion, eliminating a step difference (i.e. offset) between the IC chip and the substrate, completing the connection in a short while, and so on.

Also, the pitch of the expanded pads can be adjusted to a pitch of the interconnections that can be formed by printing. Also, the size of the expanded pads can be adjusted in correspondence with a position alignment accuracy in the printing Namely, the lower the alignment accuracy is, the larger the size of the expanded pads should be made.

Third Embodiment

Figure 11A:
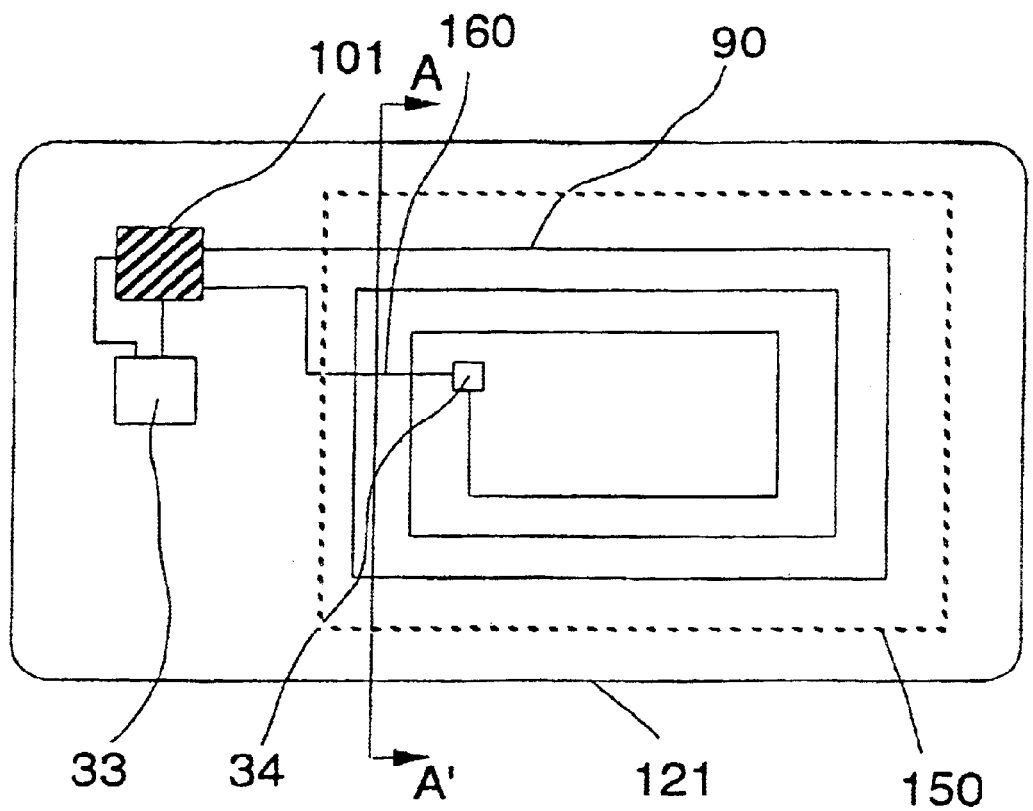
FIGS. 11A and 11B illustrate a plan view (FIG. 11A) of an IC card related with the present invention and a main portion cross sectional view thereof (FIG.
Figure 11B:
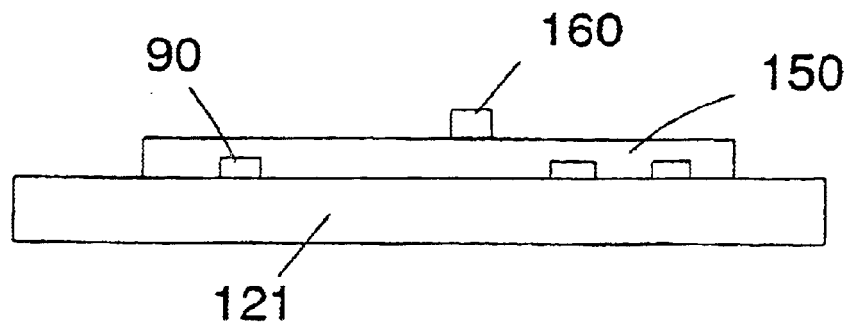

With the use of FIGS. 11A and 11B and FIG. 16, the explanation will be given below concerning the IC card fabricated using the IC chips shown in the first and the second embodiments. Using the anisotropic conductive adhesive material, the IC chip 101 and a capacitor chip 33 are fixed onto a card substrate 121 and, at the same time, are connected with a printed electrode formed on the card substrate 121. Incidentally, the capacitor chip 33 is a chip used for smoothing. As a material of the card substrate 121, PET (polyethylene terephthalate), vinyl chloride, or polycarbonate can be used. Moreover, a coil 90 having a desired configuration is formed on the card substrate 121 by the screen printing with the use of the silver paste. An insulating film having a via hole 34 is provided on the coil 90. One end of the coil 90, through the via hole 34, connects an interconnection 160, which is located on the insulating film 150 on the coil, with a coil interconnection located under the insulating film, thereby causing a coil terminal to be connected with the IC chip 101. The IC card is a wireless type IC card, i.e. a non-contact type IC card that can exchange data on a non-contact basis and can receive energy through electromagnetic wave. Gold-plated expanded pads are provided on the IC chip 101 and the surface of the capacitor chip 33. Using the anisotropic conductive adhesive film, the expanded pads are connected with the interconnection printed on the card substrate 121.

Additionally, the pattern of the above-mentioned coil 90, which serves as an antenna, is a dipole type that can receive electromagnetic wave corresponding to a high frequency band. Moreover, there can be a variety patterns of antennas, depending on the use. Thus, the pattern is not limited to the one described here.

Next, using FIG. 16, the explanation will be given below concerning the connection relation between the IC chip 101 and the coil. The IC chip includes a microprocessor chip 802 and a wireless chip 804. These chips can be integrated into one chip. However, using them in separation makes it possible to employ the mass-produced microprocessor chips. Accordingly, when the wireless type (non-contact type) semiconductor devices related with the present invention are produced in relatively small quantities, they can be manufactured at low cost.

An expanded pad 801 is provided on the microprocessor chip 802 and is connected with an expanded pad 820 on the wireless chip 804 through a printed substrate interconnection 803. Also, the substrate interconnection pattern constitutes a coil pattern 805.

A capacitor chip connected with the coil pattern 805 is a chip used for tuning. The provision of the capacitor chip makes it possible to lengthen a distance that is operable by wireless communication.

The smoothing coil can be provided within the wireless chip, but it is not necessarily required.

The present invention makes it possible to provide a low cost and highly reliable non-contact type IC card.

Figure 12:
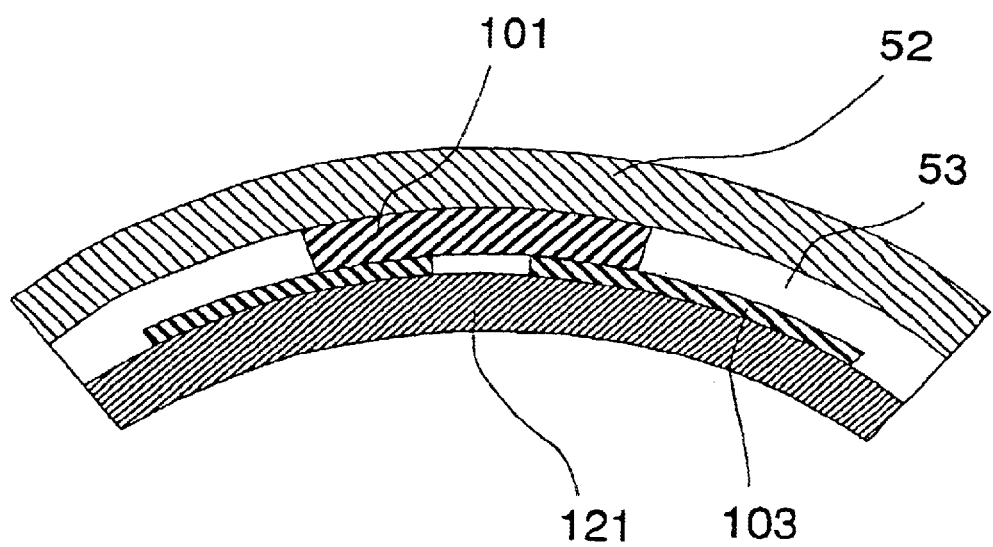
FIG. 12 is a main portion cross sectional view of the IC card related with the present invention.
Figure 13:
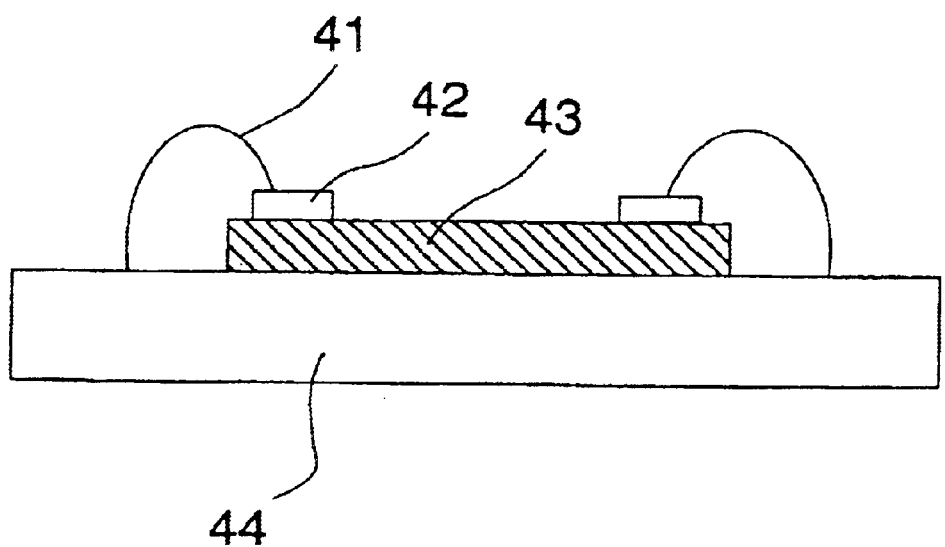
FIG. 13 is a main portion cross sectional view illustrating a connected portion between an IC chip and a substrate in a conventional IC card.

Incidentally, as is illustrated in FIG. 12, the IC chip 101 is fixed on the card substrate 121 and further is sandwiched by a second card substrate 52, thereby allowing the reliability to be enhanced even further. Printed electrodes 103 are provided on the card substrate 121 on the lower side and are electrically connected with expanded pads on the IC chip 101 by the anisotropic conductive adhesive film. The expanded pads on the IC chip 101, which are the same kind of expanded pads as illustrated in FIG. 7, allow the IC chip to be connected stably with the printed electrodes 103 on the substrate 121.

Concerning thickness of the printed electrode using the silver paste, the interconnection and the coil, the range of 10 μm to 50 μm is usable. Regarding thickness of the IC chip, the range of 1 μm to 200 μm is usable and, in particular, the range of 10 μm to 100 μm is preferable. Regarding thickness of the card substrate on the upper side and that of the card substrate on the lower side, the range of 10 μm to 500 μm is usable and, in particular, the range of 50 μm to 250 μm is preferable. The card substrates on the upper and the lower sides are bonded together by an adhesive 53. Using the IC chip 100 μm or less thick, a difference in position between a neutral plane of the IC chip and a neutral plane of the completed card is caused to be included within 30% of thickness of the completed card. This brings about a structure, as illustrated in FIG. 12, that permits bending of the IC chip to follow bending of the card. This eventually makes it possible to provide a bending-resistant and highly reliable IC card. In particular, thickness of the card substrate 121 and that of the card substrate 52 are made substantially equal to each other, thereby causing the IC chip to be located on the neutral plane of the card or in the proximity thereto. This allows a high reliability to be obtained toward the bending stress.

Figure 14:
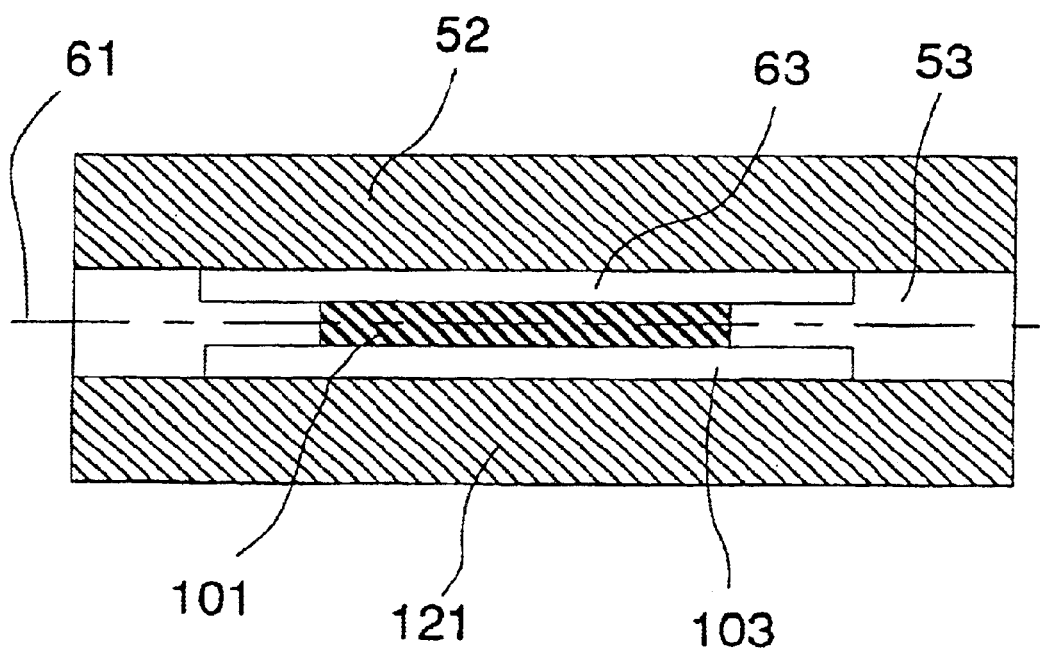
FIG. 14 is a main portion cross sectional view of the IC card related with the present invention.

Next, using FIG. 14, the explanation will be given below concerning a configuration that allows the IC chip to be located more accurately on the neutral plane of the card. FIG. 14 illustrates a cross sectional view of the card. With the neutral plane 61 of the card as a linearly symmetrical axis, the IC chip 101 is located between the card substrate 52 on the upper side and the card substrate 121 on the lower side. The IC chip 101 is connected with the printed electrodes 103 on the lower side by the anisotropic conductive adhesive. Meanwhile, on the rear surface side of the IC chip 101, i.e. on the side where there exist no elements or pads, too, a conductor film 63 formed by printing is provided and is in contact with the IC chip. In this way, the types and the thickness of the materials are selected so that the materials form a structure that is mirror-symmetrical toward the neutral plane of the IC chip. The conductor film 63 on the upper side has a shield effect toward high frequency. The electrodes 103 on the lower side are electrically connected with the expanded pads on the IC chip, and are formed by the screen printing with the use of the silver paste so that the respective electrodes have the same thickness. Also, the card substrates are selected so that the thickness of the card substrate on the upper side becomes equal to that of the card substrate on the lower side. In each of the configurations, however, an error of ±15% of the predetermined thickness is allowable. Modulus of elasticity on the upper side and the one on the lower side are made closer to each other, thereby making it possible to relax the stress applied to the IC chip.

Figure 15:
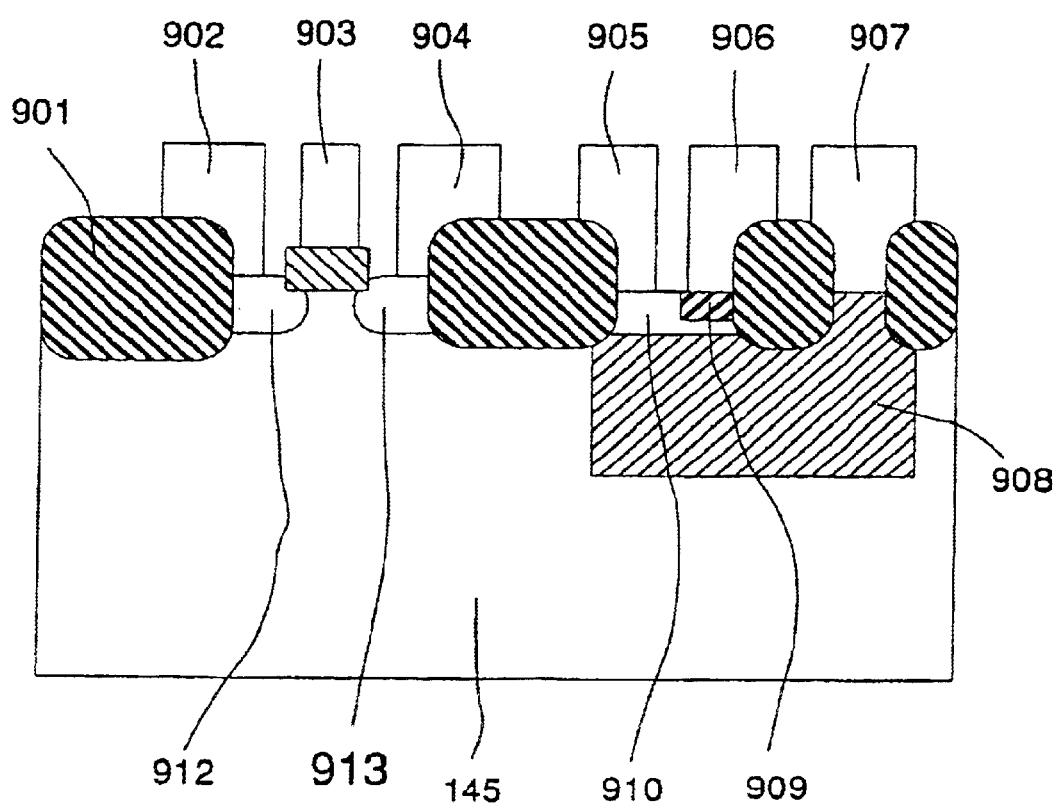
FIG. 15 is a main portion cross sectional view of an IC chip.

Next, using FIG. 15, the explanation will be given below concerning examples of elements constituting the active areas on the IC chip. FIG. 15 illustrates elements constituting the active areas in the semiconductor. On the surface of a silicon substrate 145, an isolated gate type transistor and a bipolar transistor are formed in regions separated by device separating oxide films 901.

The isolated gate type transistor includes a source region 912 and a drain region 913 composed of an impurity-doped layer, a source electrode 902 and a drain electrode 904 respectively connected to the corresponding regions, and a gate electrode 903 for controlling an electric current passing between the source region 912 and the drain region 913.

The bipolar transistor includes a collector layer 908, a base layer 910, an emitter layer 909, a collector electrode 907, a base electrode 905, and an emitter electrode 906. Here, the electrodes are connected to the corresponding layers, respectively. These electrodes are connected with each other by interconnections, thereby constituting a memory and a logic circuit. These regions are the active areas.

Incidentally, as the substrates on the upper and the lower sides, flexible magnetic card substrates can also be used. By using the magnetic card substrates and providing a magnetic information-stored region in a portion of the IC card, it is possible to share the use of the magnetic card and the IC card with the use of the single card.

What is claimed is:

1. A semiconductor device, comprising:
   a semiconductor chip,
   a first pad formed on said semiconductor chip,
   a second pad coupled to said first pad and formed on said semiconductor chip,
   an insulating substrate, and
   an antenna formed by screen printing or a wiring coupled to an antenna formed by screen printing positioned on said insulating substrate,
   wherein a size of said second pad is larger than that of said first pad, and a pitch of the second pad is larger than or equal to a minimum width of the antenna or wiring,
   said second pad is printed on an active area on which a transistor of said semiconductor chip is formed, and
   said second pad and said antenna or said wiring coupled to an antenna are connected to each other through a conductive adhesive material.

2. A semiconductor device as claimed in claim 1,
   wherein said second pad and said antenna or said wiring coupled to an antenna are positioned facing each other and are interconnected through a conductive adhesive material.

3. The semiconductor device as claimed in claim 1, wherein said IC chip has a thickness in the range of 10 $\mu$m to 100 $\mu$m.

4. The semiconductor device as claimed in claim 1, wherein said insulating substrate has a thickness in the range of 50 $\mu$m to 250 $\mu$m.

5. The semiconductor device as claimed in claim 1, wherein said IC chip is sandwiched between said insulating substrate and a second insulating substrate which is provided in a position opposed to said insulating substrate.

6. The semiconductor device as claimed in claim 5, wherein a conductor film is formed between said IC chip and said second insulating substrate.

7. The semiconductor device as claimed in claim 1, wherein
   a pitch of said second pad is wider than that of said first pad.

8. A semiconductor device, as claimed in claim 7, further comprising a wiring for connecting the second pad to the first pad,
   wherein the second pad and the wiring for connecting the second pad to the first pad are made of gold.

9. A semiconductor device, as claimed in claim 7, further comprising a wiring for connecting the second pad and the first pad; and
   wherein the second pad and said wiring for connecting the second pad and the first pad are formed in the same processing step.

10. The semiconductor device as claimed in claim 1, wherein said conductive adhesive material is an anisotropic conductive adhesive material.

11. The semiconductor device as claimed in claim 1,
    wherein a minimum interval of the antenna or wiring depends on a printed accuracy of said screen printing.

12. The semiconductor device as claimed in claim 1,
    wherein the pitch of the second pad is equal to a minimum width of the antenna or wiring.

* * * * *